US012767873B2

(12) United States Patent
Ishihara et al.

(10) Patent No.: US 12,767,873 B2
(45) Date of Patent: Oct. 20, 2026

(54) THERMALLY CONDUCTIVE FILM

(71) Applicant: SHIN-ETSU CHEMICAL CO., LTD., Tokyo (JP)

(72) Inventors: Yasuhisa Ishihara, Annaka (JP); Emi Akabane, Annaka (JP); Akihiro Endo, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 400 days.

(21) Appl. No.: 18/695,270

(22) PCT Filed: Aug. 23, 2022

(86) PCT No.: PCT/JP2022/031668

§ 371 (c)(1),
(2) Date: Mar. 25, 2024

(87) PCT Pub. No.: WO2023/047869

PCT Pub. Date: Mar. 30, 2023

(65) Prior Publication Data

US 2024/0392160 A1 Nov. 28, 2024

(30) Foreign Application Priority Data

Sep. 27, 2021 (JP) ................................ 2021-157215

(51) Int. Cl.

| | |
|---|---|
| ***C09K 5/14*** | (2006.01) |
| ***C08J 5/18*** | (2006.01) |
| ***C08K 3/013*** | (2018.01) |
| ***C08L 83/04*** | (2006.01) |
| ***C08L 91/06*** | (2006.01) |
| ***C09D 183/06*** | (2006.01) |
| ***H10W 40/25*** | (2026.01) |
| *C08G 77/20* | (2006.01) |
| *C08K 3/08* | (2006.01) |
| *C08K 3/22* | (2006.01) |

(52) U.S. Cl.

CPC .................................... *C09K 5/14* (2013.01); *C08J 5/18* (2013.01); *C08K 3/013* (2018.01); *C08L 83/04* (2013.01); *C08L 91/06* (2013.01); *C09D 183/06* (2013.01); *H10W 40/251* (2026.01); *C08G 77/20* (2013.01); *C08J 2383/07* (2013.01); *C08J 2491/06* (2013.01); *C08K 2003/0812* (2013.01); *C08K 2003/2227* (2013.01); *C08K 2003/2296* (2013.01); *C08K 2201/001* (2013.01)

(58) Field of Classification Search

CPC ......... C08G 77/20; C08J 5/18; C08J 2383/07; C08J 2491/06; C08K 3/013; C08K 3/08; C08K 3/22; C08K 2003/0812; C08K 2003/2227; C08K 2003/2296; C08K 2201/001; C08L 83/04; C08L 91/06; C09D 183/06; C09K 5/14; H10W 40/251

See application file for complete search history.

(56) References Cited

U.S. PATENT DOCUMENTS

| | | | | |
|---|---|---|---|---|
| 6,054,198 | A | 4/2000 | Bunyan et al. | |
| 6,391,442 | B1 | 5/2002 | Duvall et al. | |
| 10,745,603 | B2 * | 8/2020 | Yamada | C08K 3/00 |
| 2002/0066883 | A1 | 6/2002 | Tomaru et al. | |
| 2003/0207128 | A1 | 11/2003 | Uchiya et al. | |
| 2010/0006798 | A1 | 1/2010 | Endo | |
| 2018/0291249 | A1 | 10/2018 | Yamada | |
| 2022/0234335 | A1 | 7/2022 | Ishihara et al. | |

FOREIGN PATENT DOCUMENTS

| | | | |
|---|---|---|---|
| JP | 2000-509209 | A | 7/2000 |
| JP | 2000-327917 | A | 11/2000 |
| JP | 2000-336279 | A | 12/2000 |
| JP | 2001-089756 | A | 4/2001 |
| JP | 2001-291807 | A | 10/2001 |
| JP | 2002-121332 | A | 4/2002 |
| JP | 2002-234952 | A | 8/2002 |
| JP | 2004-075760 | A | 3/2004 |
| JP | 2007-059877 | A | 3/2007 |
| JP | 2010-018646 | A | 1/2010 |
| JP | 2010219290 | A * | 9/2010 |
| JP | 2013-086433 | A | 5/2013 |
| JP | 2017-061613 | A | 3/2017 |
| JP | 2020-203457 | A | 12/2020 |
| TW | 201734141 | A | 10/2017 |
| WO | 2020/255549 | A1 | 12/2020 |

OTHER PUBLICATIONS

Machine translation of detailed description of JP 2013-086433 acquired on Jun. 23, 2026.*

Apr. 2, 2024 International Preliminary Report on Patentability issued in International Patent Application No. PCT/JP2022/031668.

Sep. 26, 2025 Extended Search Report issued in European Patent Application No. 22872625.3.

Oct. 30, 2025 Search Report issued in Taiwanese Patent Application No. 111131994.

Mar. 11, 2026 Office Action issued in Korean Patent Application No. 10-2024-7009801.

Oct. 25, 2022 International Search Report issued in International Patent Application No. PCT/JP2022/031668.

* cited by examiner

*Primary Examiner* — Gerard Higgins

(74) *Attorney, Agent, or Firm* — Oliff PLC

(57) ABSTRACT

A thermally conductive film including: a silicone resin at 100 parts by mass, the silicone resin being one or more selected from: $D_mT^{\varphi}{}_pD^{Vi}{}_n$, wherein D represents a siloxane unit represented by $(CH_3)_2SiO_{2/2}$, $T^{\varphi}$ represents a siloxane unit represented by $(C_6H_5)SiO_{3/2}$, $D^{Vi}$ represents a siloxane unit represented by $(CH_3)(CH_2{=}CH)SiO_{2/2}$, "m" represents an integer of 35 to 55, "n" represents an integer of 30 to 60, and "p" represents an integer of 40 to 70; or $M_LD_xT^{\varphi}{}_q\,D^{Vi}{}_y$, wherein M represents $(CH_3)_3SiO_{1/2}$, L represents an integer of 10 to 30, "x" represents an integer of 15 to 35, "y" represents an integer of 40 to 60, and "q" represents an integer of 45 to 55, the silicone resin having non-flowability at 25° C.; a wax having a melting point of 20 to 60° C. at 5 to 300 parts by mass; and a thermally conductive filler at 1,000 to 6,000 parts by mass.

8 Claims, No Drawings

THERMALLY CONDUCTIVE FILM

TECHNICAL FIELD

The present invention relates to a thermally conductive film suitable for cooling an electronic component.

BACKGROUND ART

Methods for inhibiting rise in temperature of an electronic component in an electronic device, etc. conventionally include a method of directly conducting heat toward a heat sink using a metal having a high thermal conductivity. This heat sink conducts heat generated from the electronic component to radiate the heat from a surface with temperature difference from outside air. To efficiently conduct the heat generated from the electronic component toward the heat sink, the heat sink and the electronic component are necessarily adhered to each other without a gap. Accordingly, a low-hardness thermally conductive sheet having flexibility or a thermally conductive grease is interposed between the electronic component and the heat sink.

Although the low-hardness thermally conductive sheet has excellent handling operability, it is difficult to thin the sheet. In addition, the sheet cannot follow fine roughness on a surface of the electronic component or the heat sink, and the sheet has a problem of increased contact thermal resistance to fail to efficiently conduct the heat.

Meanwhile, the thermally conductive grease can be thinned, and thereby a distance between the electronic component and the heat sink can be reduced. Further, fine roughness on the surface can be filled to remarkably reduce thermal resistance. However, the thermally conductive grease has poor handleability and contaminates the periphery, and has a problem of separation of an oil component in the grease (pumping out) due to a heat cycle to deteriorate thermal characteristics.

In recent years, many thermosoftening materials have been proposed as a thermally conductive member having both the characteristics of the handleability of the low-hardness thermally conductive sheet and the low thermal resistance of the thermally conductive grease. This material is a solid with good handleability at room temperature, and softened or melted by heat generated from the electronic component.

Patent Document 1 proposes: a thermally conductive material composed of an acrylic pressure-sensitive adhesive, an α-olefin thermal plasticizer, and a thermally conductive filler; or a thermally conductive material composed of a paraffin wax and a thermally conductive filler. Patent Document 2 proposes a thermally conductive composition composed of a thermoplastic resin, a wax, and a thermally conductive filler. Patent Document 3 proposes a thermal interface material composed of a polymer such as acrylic polymer, an alcohol having 12 to 16 carbon atoms, a melting point component such as a petroleum wax, and a thermally conductive filler. Patent Document 4 proposes a thermosoftening heat-radiating sheet composed of a polyolefin and a thermally conductive filler.

However, these materials are all organic-substance-based materials, and deterioration at high temperature is concerned.

Meanwhile, silicones are known as a material having excellent heat resistance, weather resistance, and flame retardance, and many silicone-based thermosoftening materials similar to the above have been proposed.

Patent Document 5 proposes a composition composed of a thermoplastic silicone resin, a wax-like modified silicone resin, and a thermally conductive filler. Patent Document 6 proposes a thermally conductive sheet composed of a binder resin such as a silicone gel, a wax, and a thermally conductive filler. Patent Document 7 proposes a thermosoftening heat-radiating sheet composed of a polymer gel such as a silicone gel, a compound to be liquid by heating such as a modified silicone and a wax, and a thermally conductive filler.

However, it is difficult to achieve a high thermal conductivity as prescribed in the present application at an addition amount of the thermally conductive filler in examples of these documents.

Patent Document 8 achieves thinning by prescribing a particle diameter and a sieve fraction of a contained thermally conductive filler with a silicone resin base. However, the thermal conductivity is approximately 5 W/m·K according to Examples, and it is considered that the film has difficulty in exhibiting handleability and flexibility within a high thermally conductive region of 6 W/m·K or higher.

CITATION LIST

Patent Literature

Patent Document 1: JP 2000-509209 A
Patent Document 2: JP 2000-336279 A
Patent Document 3: JP 2001-089756 A
Patent Document 4: JP 2002-121332 A
Patent Document 5: JP 2000-327917 A
Patent Document 6: JP 2001-291807 A
Patent Document 7: JP 2002-234952 A
Patent Document 8: JP 2007-059877 A

SUMMARY OF INVENTION

Technical Problem

The conventional art has a problem of the film having difficulty in achievement of both the handleability and the flexibility within a high thermally conductive region.

The present invention has been made to solve the above problem. An object of the present invention is to provide a thermally conductive film being a film and having good handleability at normal temperature even within a high thermally conductive region of a thermal conductivity of higher than 6 W/m·K, and being softened by heat.

Solution to Problem

To solve the above problem, the present invention provides a thermally conductive film comprising:

a silicone resin (A) at 100 parts by mass, the silicone resin being one or more selected from the following formula (1) or (2):

$$D_m T^{\varphi}_p D^{Vi}_n \tag{1}$$

wherein D represents a siloxane unit represented by $(CH_3)_2SiO_{2/2}$, $T^{\varphi}$ represents a siloxane unit represented by $(C_6H_5)SiO_{3/2}$, $D^{Vi}$ represents a siloxane unit represented by $(CH_3)(CH_2{=}CH)SiO_{2/2}$, "m" represents an integer of 35 to 55, "n" represents an integer of 30 to 60, "p" represents an integer of 40 to 70, (m+n)/m=1.0 to 4.0, and (m+n)/p=0.25 to 4.0;

$$M_L D_x T^{\varphi}_q D^{Vi}_y \tag{2}$$

wherein M represents $(CH_3)_3SiO_{1/2}$, D, $T^{\varphi}$, and $D^{Vi}$ represent the same as above, L represents an integer of 10 to 30, "x" represents an integer of 15 to 35, "y" represents an integer of 40 to 60, "q" represents an integer of 45 to 55, L/(x+y)=0.001 to 0.4, (x+y)/x=1.0 to 4.0, and (x+y)/q=0.25 to 4.0, the silicone resin having non-flowability at 25° C.;

a wax (B) having a melting point of 20 to 60° C. at 5 to 300 parts by mass, the melting point being measured with a differential scanning calorimeter in accordance with JIS K7121:2012; and a thermally conductive filler (C) at 1,000 to 6,000 parts by mass relative to 100 parts by mass of the component (A).

The thermally conductive film of the present invention as above is a film having good handleability at normal temperature within a high thermally conductive region of a thermal conductivity of higher than 6 W/m·K, and is softened by heat to follow fine roughness on a surface of an electronic component and a surface of a heat sink, which can reduce contact thermal resistance to efficiently conduct heat.

In this case, the component (A) preferably has a softening point of 30 to 65° C., the softening point being measured by using a softening point measurement apparatus in accordance with JIS K2207:1996.

The thermally conductive film of the present invention as above has excellent flexibility at normal temperature, easy handleability, good shape maintainability, and excellent handleability when formed as a film.

The wax of the component (B) is preferably one or more selected from a paraffin wax, an ester wax, and a silicone wax.

The thermally conductive film containing such a wax has good heat resistance.

In the thermally conductive film of the present invention, the thermally conductive filler of the component (C) is preferably one or more selected from silver, aluminum, alumina, aluminum nitride, aluminum hydroxide, magnesia, and zinc oxide.

In the present invention, such a thermally conductive filler can be suitably contained.

Advantageous Effects of Invention

As above, the thermally conductive film of the present invention is a film having good handleability at normal temperature even within a high thermally conductive region of a thermal conductivity of higher than 6 W/m·K, and can be softened by heat.

In addition, the thermally conductive film of the present invention is softened by heat, and thereby can follow fine roughness on a heat-generating element and cooling member, and can be thinned. Accordingly, good heat-radiating ability can be exhibited.

DESCRIPTION OF EMBODIMENTS

As noted above, there has been a demand for development of the thermally conductive film that can achieve both of handleability of the film and flexibility even within a high thermally conductive region.

The present inventors have earnestly studied the above problem, consequently, have found that both the handleability and flexibility can be achieved even within a high thermally conductive region by a thermally conductive film comprising: a non-flowable silicone resin having specific siloxane units; a wax having a melting point within a specific range; and a thermally conductive filler at a specific proportion, and have completed the present invention.

Specifically, the present invention is a thermally conductive film comprising:

a silicone resin (A) at 100 parts by mass, the silicone resin being one or more selected from the following formula (1) or (2):

$$D_m T^{\varphi}_p D^{Vi}_n \quad (1)$$

wherein D represents a siloxane unit represented by $(CH_3)_2SiO_{2/2}$, $T^{\varphi}$ represents a siloxane unit represented by $(C_6H_5)SiO_{3/2}$, $D^{Vi}$ represents a siloxane unit represented by $(CH_3)$ $(CH_2{=}CH)$ $SiO_{2/2}$, "m" represents an integer of 35 to 55, "n" represents an integer of 30 to 60, "p" represents an integer of 40 to 70, (m+n)/m=1.0 to 4.0, and (m+n)/p=0.25 to 4.0;

$$M_L D_x T^{\varphi}_q D^{Vi}_y \quad (2)$$

wherein M represents $(CH_3)_3SiO_{1/2}$, D, $T^{\varphi}$, and $D^{Vi}$ represent the same as above, L represents an integer of 10 to 30, "x" represents an integer of 15 to 35, "y" represents an integer of 40 to 60, "q" represents an integer of 45 to 55, L/(x+y)=0.001 to 0.4, (x+y)/x=1.0 to 4.0, and (x+y)/q=0.25 to 4.0, the silicone resin having non-flowability at 25° C.;

a wax (B) having a melting point of 20 to 60° C. at 5 to 300 parts by mass, the melting point being measured with a differential scanning calorimeter in accordance with JIS K7121:2012; and a thermally conductive filler (C) at 1,000 to 6,000 parts by mass relative to 100 parts by mass of the component (A).

Hereinafter, the present invention will be described in detail, but the present invention is not limited thereto.

The thermally conductive film of the present invention comprises: the component (A) of the non-flowable silicone resin having the specific siloxane units; the component (B) of the wax having the specific melting point; and the component (C) of the thermally conductive filler. In addition to these essential components, optional components may be contained. Hereinafter, the components to constitute the thermally conductive film will be described.

(A) Non-Flowable Silicone Resin

The component (A) of the present invention is a silicone resin having non-flowability at 25° C., and forms a matrix of the thermally conductive film (heat radiator) of the present invention. The component (A) is one of factors of the heat radiator to cause thermosoftening, and also has a role as a binder to impart processability and operability to a filling material that imparts thermal conductivity to the heat radiator. The component (A) is preferably a material to flow with thermosoftening, reduced viscosity, or melted within a temperature range of: a predetermined temperature or higher; and a highest reaching temperature, which is caused by heat generation of a heat-generating electronic component, or lower.

Specifically, the component (A) of the present invention is a silicone resin (A) being one or more selected from the following formula (1) or (2):

$$D_m T^{\varphi}_p D^{Vi}_n \quad (1)$$

wherein D represents a siloxane unit represented by $(CH_3)_2SiO_{2/2}$, $T^{\varphi}$ represents a siloxane unit represented by $(C_6H_5)SiO_{3/2}$, $D^{Vi}$ represents a siloxane unit represented by $(CH_3)$ $(CH_2{=}CH)SiO_{2/2}$, "m" represents an integer of 35 to 55, "n" represents an integer of 30 to 60, "p" represents an integer of 40 to 70, (m+n)/m=1.0 to 4.0, and (m+n)/p=0.25 to 4.0;

$$M_LD_xT^{\varphi}_qD^{Vi}_y \quad (2)$$

wherein M represents $(CH_3)_3SiO_{1/2}$, D, $T^{\varphi}$, and $D^{Vi}$ represent the same as above, L represents an integer of 10 to 30, "x" represents an integer of 15 to 35, "y" represents an integer of 40 to 60, "q" represents an integer of 45 to 55, L/(x+y)=0.001 to 0.4, (x+y)/x=1.0 to 4.0, and (x+y)/q=0.25 to 4.0, the silicone resin having non-flowability at 25° C.

Here, "non-flowability" refers to a state having no flowability, and more specifically refers to a state where the shape does not change with left to stand, or where the shape can be retained even after a long time of, for example, approximately 8 hours.

The softening point of the component (A) is preferably 30 to 65° C., and more preferably 45 to 60° C. The softening point of 65° C. or lower exhibits excellent flexibility at normal temperature when the film is formed, and yields easy handleability. The softening point of 30° C. or higher yields good shape maintainability at normal temperature when the film is formed, and yields excellent handleability.

The softening point in the present invention refers to a value measured by using a softening point measurement apparatus (manufactured by Dai-Ichi-Rika Corporation) in accordance with JIS K2207:1996. When the component (A) is composed of a plurality of silicone resins, the softening point thereof refers to a value measured on the mixture.

The silicone resin represented by the formula (1) ($D_mT^{\varphi}_pD^{Vi}_n$) is a non-flowable silicone resin having a bifunctional structural unit (D unit) and a trifunctional structural unit (T unit) at a specific composition. In the formula (1), D represents a siloxane unit represented by $(CH_3)_2SiO_{2/2}$, $T^{\varphi}$ represents a siloxane unit represented by $(C_6H_5)SiO_{3/2}$, and $D^{Vi}$ represents a siloxane unit represented by $(CH_3)(CH_2{=}CH)SiO_{2/2}$. "m" represents an integer of 35 to 55, and preferably 35 to 45. "n" represents an integer of 30 to 60, and preferably 30 to 50. "p" represents an integer of 40 to 70, and preferably 40 to 60.

In the formula (1), a mole ratio of (m+n)/p is 0.25 to 4.0, and preferably 0.8 to 3.0. A mole ratio of (m+n)/m is 1.0 to 4.0, and preferably 1.0 to 3.0.

Examples of the silicone resin non-flowable at 25° C. and represented by the formula (1) include the followings:

$D_{45}T^{\varphi}_{55}D^{Vi}_{55}$; and $D_{40}T^{\varphi}_{40}D^{Vi}_{40}$.

The silicone resin represented by the formula (2) ($M_LD_xT^{\varphi}_qD^{Vi}_y$) is a non-flowable silicone resin having a monofunctional structural unit (M unit), a bifunctional structural unit (D unit), and a trifunctional structural unit (T unit) at a specific composition. In the formula (2), M represents $(CH_3)_3SiO_{1/2}$. D, $T^{\varphi}$, and $D^{Vi}$ represent the same as above. L represents an integer of 10 to 30, and preferably 10 to 20. "x" represents an integer of 15 to 35, and preferably 15 to 25. "y" represents an integer of 40 to 60, and preferably 40 to 50. "q" represents an integer of 45 to 55, and preferably 45 to 50.

In the formula (2), a mole ratio of (x+y)/q is 0.25 to 4.0, and preferably 0.8 to 3.0. A mole ratio of (x+y)/x is 1.0 to 4.0, and preferably 1.0 to 3.0. Further, a mole ratio of L/(x+y) is 0.001 to 0.4, and preferably 0.1 to 0.4.

Examples of the silicone resin non-flowable at 25° C. and represented by the formula (2) include the followings:

$M_{20}D_{25}T^{\varphi}_{55}D^{Vi}_{50}$; and $M_{15}D_{20}T^{\varphi}_{45}D^{Vi}_{40}$.

If the component (A) is a resin other than the silicone resin represented by the formula (1) or (2) (for example, an MQ resin composed of the M unit and the Q unit), the thermally conductive film has poor flexibility to deteriorate handleability.

As the component (A) of the present invention, the silicone resin represented by the formula (1) or (2) may be used each singly, or may be mixed for use.

(B) Wax

The component (B) of the present invention is a wax having a melting point of 20 to 60° C. The melting point is preferably 20 to 40° C. If the melting point is higher than 60° C., the formed film lacks poor flexibility at normal temperature to cause difficulty in handleability. If the melting point is lower than 20° C., the formed film lacks shape maintainability at normal temperature to cause difficulty in handleability.

The component (B) is not particularly limited as long as it is a wax having a melting point of 20 to 60° C., but the wax is preferably one or more selected from a paraffin wax, an ester wax, and a silicone wax with considering heat resistance of the thermally conductive film of the present invention, and may be a mixture or combination (copolymer, etc.) of two or more thereof. Such a wax is more preferably a silicone wax, and further preferably a graft-copolymer wax of an acryl polymer and a polysiloxane.

Examples of the paraffin wax include Paraffin Wax 115, Paraffin Wax 120, Paraffin Wax 125, Paraffin Wax 130, and Paraffin Wax 135 (the above are manufactured by NIPPON SEIRO CO., LTD.). Examples of the ester wax include: an ester between a carboxylic acid having 6 or more carbon atoms and an alcohol; an ester between a monocarboxylic acid having 6 or more carbon atoms and a polyhydric alcohol; and an ester between a polyvalent carboxylic acid having 6 or more carbon atoms and a monohydric alcohol having 6 or more carbon atoms. Examples of the silicone wax include an alkyl-modified silicone wax and a graft-copolymer wax of an acryl polymer and a polysiloxane, and examples of the graft-copolymer wax of an acryl polymer and a polysiloxane include KP-561P (stearyl-modified acrylate silicone, manufactured by Shin-Etsu Chemical Co., Ltd.).

The melting point in the present invention refers to a value measured with a differential scanning calorimeter in accordance with JIS K7121:2012.

A content of the component (B) is 5 to 300 parts by mass, preferably 10 to 200 parts by mass, and more preferably 10 to 100 parts by mass relative to 100 parts by mass of the component (A). If the content is less than 5 parts by mass, the formed film lacks flexibility at normal temperature to cause difficulty in productivity and handleability. If the content is more than 300 parts by mass, the formed film lacks shape maintainability at normal temperature to cause difficulty in handleability.

(C) Thermally Conductive Filler

The component (C) of the present invention is a thermally conductive filler. Specific examples thereof include: non-magnetic metals such as copper and aluminum; metal oxides such as alumina, silica, magnesia, red oxide, beryllia, titania, and zirconia; metal nitrides such as aluminum nitride, silicon nitride, and boron nitride; metal hydroxides such as aluminum hydroxide and magnesium hydroxide; and artificial diamond or silicon carbide. Among these, silver, aluminum, alumina, aluminum nitride, aluminum hydroxide, magnesia, and zinc oxide are preferable. The thermally conductive filler preferably has an average particle diameter of 0.1 to 200 μm, and may be used singly or in combination of two or more thereof. When two or more of the filler are used in combination, different types of the thermally conductive fillers may be combined, or a same type of the thermally conductive filler with different average particle diameters may be combined.

The thermally conductive filler may have various shapes such as a spherical, pseudospherical, crushed, flake, and fibrous shapes, and the shape is not particularly limited.

Of course, the particle diameter and sieve fraction of the thermally conductive filler may be prescribed to regulate a thickness of the thermally conductive film after crimping.

The average particle diameter is a value of a cumulative average particle diameter (median diameter) on a volumetric basis measured by a laser diffraction/scattering method (Microtrac method) using Microtrac MT3300EX, which is a particle size analyzer manufactured by Microtrac BEL Corp.

A content of the thermally conductive filler is 1,000 to 6,000 parts by mass, preferably 1,000 to 4,000 parts by mass, and more preferably 1,000 to 3,000 parts by mass relative to 100 parts by mass of the component (A). If the content is less than 1,000 parts by mass, the sufficient thermal conductivity cannot be exhibited. If the content is more than 6,000 parts by mass, filling itself becomes difficult.

Other Additives

In addition to the essential components (A), (B), and (C), additives such as a flame-retardance imparting agent, a lubricant, a heat-resistance improving agent, a plasticizer, and a surface treating agent such as a silane coupling agent may be added according to the purpose.

Thermally Conductive Film

The thermally conductive film of the present invention comprises the above components (A) to (C), and is a thermally conductive member having both the characteristics of handleability of the low-hardness thermally conductive sheet and the low thermal resistance of the thermally conductive grease. The thermally conductive film has a feature of being solid with good handleability at room temperature, and being softened by heat generated from an electronic component.

This feature solves the problem of the conventional art on the low-hardness thermally conductive sheet: the sheet has excellent handling handleability, but difficult to be thinned and cannot follow fine roughness on a surface of the electronic component and a heat sink, and thereby contact thermal resistance becomes large to fail to efficiently conduct heat.

Method for Manufacturing Thermally Conductive Film

A method for manufacturing the thermally conductive film of the present invention is not particularly limited, and may be a known method. For example, a thermosoftening thermally conductive composition to yield the thermally conductive film of the present invention can be easily manufactured by blending and kneading the above components using a rubber kneader such as a dough mixer (kneader), a gate mixer, and a planetary mixer.

Then, the thermosoftening thermally conductive composition is formed into a film. Here, the term “film” is used as a meaning including a sheet and a tape. Examples of a method for forming the film include: a method of shaping the mixed and kneaded composition by a method such as extrusion molding, calendar molding, roll molding, and press molding; and a method of applying the dissolved composition in a solvent.

A thickness of the thermally conductive film manufactured as above is preferably 20 to 200 μm, more preferably 20 to 100 μm, and particularly preferably 30 to 80 μm. With the thickness within this range, good handleability and heat-radiation performance are easily retained.

The thermally conductive film of the present invention can be manufactured as follows.

The components of the silicone resin (A), the wax (B), the thermally conductive filler (C), etc. are kneaded by using a kneading apparatus such as a planetary mixer or a kneader to prepare the thermally conductive composition. Into the thermally conductive composition, an organic solvent such as toluene or xylene is added, the mixture is further kneaded to prepare an applying liquid, and the applying liquid is applied on a release film. The component (A) may be dissolved into the above organic solvent in advance to prepare a solution containing a predetermined non-volatile component. The applying liquid is applied by an applying method such as bar coating and spin coating, and then the organic solvent is evaporated to obtain the target thermally conductive film.

Thermal Conductivity

The thermal conductivity of the thermally conductive film is preferably 6 W/m·K or higher, and more preferably 7 W/m·K or higher. The thermal conductivity of 6 W/m·K or higher is preferable because the thermal conductivity can respond to the demand of heat radiation performance that has been increasingly required in recent years.

The thermal conductivity can be determined as follows.

The thermally conductive film produced above is sandwiched between two disk-shaped standard aluminum plates (purity: 99.99%, diameter: approximately 12.7 mm, thickness: approximately 1.0 mm), and pressure and heat are applied to perform crimping. Then, a whole thickness including the thickness of the two standard aluminum plates is measured, and the previously known thickness of the standard aluminum plates is subtracted to measure a thickness of the thermally conductive film after the crimping. For measuring the thickness, a micrometer (manufactured by Mitutoyo Corporation, model number: M820-25VA) may be used. The thermal resistance in the state sandwiched with the standard aluminum plates is measured by using a micro-flash measurement apparatus (manufactured by NETZSCH-Geratebau GmbH), and the thermal resistance corresponding to the aluminum plates is subtracted to calculate the thermal resistance of the thermally conductive film. Then, the thickness of the thermally conductive film, measured in advance, is divided by the thermal resistance to calculate the thermal conductivity of the thermally conductive film.

As above, the thermally conductive film of the present invention is a film having good handleability at normal temperature even within a high thermally conductive region of a thermal conductivity of higher than 6 W/m·K. In addition, the thermally conductive film can be softened by heat to follow fine roughness on a heat-generating element and a cooling member. Further, the thermally conductive film can be thinned to reduce contact thermal resistance and efficiently conduct heat, which can exhibit good heat radiating performance.

EXAMPLE

Hereinafter, Examples and Comparative Examples will be shown to specifically describe the present invention, but the present invention is not limited to the following Examples. The dynamic viscosity shown below is a measured value at 25° C. with a Cannon-Fenske viscosimeter and measured by a method described in JIS Z8803:2011. The non-volatile content is a value calculated with the following formula from masses determined before and after heating a sample at 150° C. for 3 hours, with precisely weighing 10 g of the sample on an aluminum dish with 6 cm in diameter.

Non-volatile content (%)=[1−{(Weighed value before heating (g)−Weighed value after heating (g))/Weighed value before heating (g)}]/100

The average particle diameter shown below is a value of a cumulative average particle diameter (median diameter) on a volumetric basis measured by a laser diffraction/scattering method (Microtrac method) using Microtrac MT3300EX, which is a particle size analyzer manufactured by Microtrac BEL Corp. The melting point shown below is a value measured with a differential scanning calorimeter in accordance with JIS K7121:2012.

(A) Non-Flowable Silicone Resin (A-1)

A toluene solution (non-volatile content 85%: dynamic viscosity 500 mm²/s) of $$D_m T^{\varphi}_p D^{Vi}_n \quad (1)$$

m=45, n=55, p=55

Softening point; 50° C.

(A-2)

A toluene solution (non-volatile content 85%: dynamic viscosity 700 mm²/s) of $$M_L D_x T^{\varphi}_q D^{Vi}_y \quad (2)$$

L=20, x=25, y=50, q=55

Softening point; 60° C.

(A-3)

A toluene-solution (non-volatile content 70%: dynamic viscosity 30 mm²/s) of a silicone resin composed of only an M unit and a Q unit (M/Q mole ratio: 1.15) Softening point; 120° C. or higher (B) Wax (B-1)

KP-561P (Stearyl-modified acrylate silicone, manufactured by Shin-Etsu Chemical Co., Ltd.) Melting point; 30° C.

(B-2)

Paraffin Wax 115 (manufactured by NIPPON SEIRO CO., LTD.)

Melting point; 48° C.

(B-3)

Paraffin Wax 155 (manufactured by NIPPON SEIRO CO., LTD.)

Melting point; 70° C.

(C) Thermally Conductive Filler (C-1) Average particle diameter 10 μm, spherical aluminum powder (C-2) Average particle diameter 1 μm, spherical aluminum powder (C-3) Average particle diameter 0.5 μm, zinc oxide powder (C-4) Average particle diameter 45 μm, spherical alumina powder (C-5) Average particle diameter 10 μm, spherical alumina powder (C-6) Average particle diameter 1 μm, crushed alumina powder Other Additives (D) KBM-3103 (3,3,3-Trifluoropropyltrimethoxysilane, manufactured by Shin-Etsu Chemical Co., Ltd.)

(E) KF-54 (Methylphenylsilicone oil, manufactured by Shin-Etsu Chemical Co., Ltd.)

Examples 1 to 8 and Comparative Examples 1 to 4

Thermally conductive compositions were prepared as follows to obtain thermally conductive films of Examples 1 to 8 and Comparative Examples 1 to 4. The obtained thermally conductive films were each subjected to the following evaluations. Table 1 shows the results.

Preparing Method

The above components were fed into a planetary mixer at a ratio described in Table 1, and the mixture was stirred and homogenized to obtain a thermally conductive composition. An appropriate amount of toluene was added into the composition so that a viscosity after dilution was between 1,000 to 5,000 Pa-s, and the mixture was further stirred and homogenized to obtain an applying liquid.

The applying liquid was applied on a fluorine release film with a comma coater, and the contained solvent was evaporated at 80° C. for 15 minutes and subsequently 100° C. for 10 minutes to obtain a thermally conductive film. On the thermally conductive film, a fluorine release film was further thermally crimped by using a laminator under conditions of 80° C., 0.3 MPa, and 1 m/min.

The thermally conductive film was formed so that a thickness of the film was 250 μm excluding a thickness of the fluorine release films.

The viscosity (absolute viscosity) after the dilution was a value at 25° C. measured with a rotary viscosimeter in accordance with a method described in JIS K7117-1:1999.

Evaluation Method (Thermal Conductivity)

The thermally conductive film produced above was sandwiched between two disk-shaped standard aluminum plates (purity: 99.99%, diameter: approximately 12.7 mm, thickness: approximately 1.0 mm), and pressure and heat were applied to perform crimping. Then, a whole thickness including the thickness of the two standard aluminum plates was measured, and the previously known thickness of the standard aluminum plates was subtracted to measure a thickness of the thermally conductive film after the crimping. For measuring the thickness, a micrometer (manufactured by Mitutoyo Corporation, model number: M820-25VA) was used. The thermal resistance in the state sandwiched with the standard aluminum plates was measured with a micro-flash measurement apparatus (manufactured by NETZSCH-Geratebau GmbH), and the thermal resistance corresponding to the aluminum plates was subtracted to calculate the thermal resistance of the thermally conductive film. Then, the thickness of the thermally conductive film, measured in advance, was divided by the thermal resistance to calculate the thermal conductivity of the thermally conductive film.

(Handleability)

The obtained thermally conductive film was cut to a shape with 20×50 mm, the fluorine release film on one side was released, a 2-kgf rubber roller was pressed twice against the aluminum plate at a rate of 500 mm/s. Thereafter, evaluated was whether the thermally conductive film was adhered to the aluminum plate and the remained fluorine release film on the opposite side was releasable.

TABLE 1

| | Ex. 1 | Ex. 2 | Ex. 3 | Ex. 4 | Ex. 5 | Ex. 6 | Ex. 7 | Ex. 8 | Comp. Ex. 1 | Comp. Ex. 2 | Comp. Ex. 3 | Comp. Ex. 4 |
|---|---|---|---|---|---|---|---|---|---|---|---|---|
| (A-1) | 100 | 100 | 100 | 100 | 100 | | 100 | 100 | 100 | | 100 | 100 |
| (A-2) | | | | | | 100 | | | | | | |
| (A-3) | | | | | | | | | | 100 | | |
| (B-1) | 20 | 168 | 12 | 8 | | 150 | 250 | 40 | 400 | 168 | | 250 |
| (B-2) | | | | | 20 | | | | | | | 20 |
| (B-3) | | | | | | | | | | | 168 | |
| (C-1) | 882 | 1891 | | 750 | 720 | 1700 | 3000 | 600 | 3000 | 1891 | 1891 | 3500 |
| (C-2) | 314 | 672 | | 280 | 312 | 670 | 1600 | 420 | 1600 | 672 | 672 | 2500 |
| (C-3) | 235 | 504 | | 156 | 260 | 450 | 1000 | 250 | 1000 | 504 | 504 | 1200 |
| (C-4) | | | 750 | | | | | | | | | |
| (C-5) | | | 500 | | | | | | | | | |
| (C-6) | | | 400 | | | | | | | | | |
| Parts by mass of component (C) relative to 100 parts by mass of component (A) | 1431 | 3067 | 1650 | 1186 | 1292 | 2820 | 5600 | 1270 | 5600 | 3067 | 3067 | 7200 |
| (D) | 12 | 25 | | 12 | 12 | 25 | 30 | 20 | 30 | 25 | 25 | 30 |
| (E) | 6 | | | 6 | 9 | 6 | | | | | | |
| Thermal conductivity (W/m · K) | 8.0 | 7.4 | 7.1 | 7.3 | 7.1 | 7.5 | 10.2 | 6.6 | — | — | — | — |
| Handlability | pass | pass | pass | pass | pass | pass | pass | pass | failure | failure | failure | — |

The amounts of the component (A) in Table are amounts of a pure content of the polymer in each polymer solution.

In Comparative Examples 1 to 3, the thermal conductivity of the film failed to be measured.

In Comparative Example 4, the film failed to be formed, and the thermal conductivity and the handleability were not evaluated.

As is obvious from Table 1, the thermally conductive films of the present invention (Examples 1 to 8) can have a thermal conductivity of more than 6 W/m·K, and even within such a high thermally conductive region, the thermally conductive films are films having good handleability at normal temperature, and softened by heat. Particularly, the thermal conductivity of more than 7 W/m·K can be achieved even when the amount of the thermally conductive filler (C) is as small as approximately 1,100 to 1,300 parts by mass relative to 100 parts by mass of the component (A) (Examples 4 and 5), and the high thermal conductivity of more than 10 W/m·K can be achieved while keeping the good handleability even with high filling of approximately 6,000 parts by mass (Example 7).

Meanwhile, a case of the excessively added component (B) as Comparative Example 1 formed a film but exhibited poor shape retainability, leading to handleability failure and difficulty in the evaluation of thermal conductivity. Use of the component (A) other than the formula (1) or (2) as Comparative Example 2 formed a film but exhibited poor flexibility, leading to handleability failure and difficulty in the evaluation of thermal conductivity. A case where the component (B) had a melting point of higher than 60° C. as Comparative Example 3 formed a film but exhibited poor flexibility, leading to handleability failure and difficulty in the evaluation of thermal conductivity. A case where the filling amount of the thermally conductive filler was more than 6,000 parts by mass as Comparative Example 4 caused difficulty in filling to begin with, and failed to form a film.

As described above, the thermally conductive film of the present invention includes the silicone resin non-flowable at 25° C. and the wax having a melting point of 20° C. to 60° C. as polymer components, and the thermally conductive filler. The thermally conductive film of the present invention has excellent handleability in spite of the thermal conductivity of 6 W/m·K or higher.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. A thermally conductive film, comprising:

a silicone resin (A) at 100 parts by mass, the silicone resin being one or more selected from the following formula (1) or (2):

$$D_m T^{\varphi}_p D^{Vi}_n \qquad (1)$$

wherein D represents a siloxane unit represented by $(CH_3)_2SiO_{2/2}$, $T^{\varphi}$ represents a siloxane unit represented by $(C_6H_5)SiO_{3/2}$, $D^{Vi}$ represents a siloxane unit represented by $(CH_3)(CH_2{=}CH)SiO_{2/2}$, "m" represents an integer of 35 to 55, "n" represents an integer of 30 to 60, "p" represents an integer of 40 to 70, (m+n)/m=1.0 to 4.0, and (m+n)/p=0.25 to 4.0;

$$M_L D_x T^{\varphi}_q D^{Vi}_y \qquad (2)$$

wherein M represents $(CH_3)_3SiO_{1/2}$, D, $T^{\varphi}$, and $D^{Vi}$ represent the same as above, L represents an integer of 10 to 30, "x" represents an integer of 15 to 35, "y" represents an integer of 40 to 60, "q" represents an integer of 45 to 55, L/(x+y)=0.001 to 0.4, (x+y)/x=1.0 to 4.0, and (x+y)/q=0.25 to 4.0, the silicone resin having non-flowability at 25° C.;

a wax (B) having a melting point of 20 to 60° C. at 5 to 300 parts by mass, the melting point being measured with a differential scanning calorimeter in accordance with JIS K7121:2012; and a thermally conductive filler (C) at 1,000 to 6,000 parts by mass relative to 100 parts by mass of the component (A).

2. The thermally conductive film according to claim 1, wherein the component (A) has a softening point of 30 to 65° C., the softening point being measured by using a softening point measurement apparatus in accordance with JIS K2207:1996.

3. The thermally conductive film according to claim 1, wherein the wax of the component (B) is one or more selected from a paraffin wax, an ester wax, and a silicone wax.

4. The thermally conductive film according to claim 2, wherein the wax of the component (B) is one or more selected from a paraffin wax, an ester wax, and a silicone wax.

5. The thermally conductive film according to claim 1, wherein the thermally conductive filler of the component (C) is one or more selected from silver, aluminum, alumina, aluminum nitride, aluminum hydroxide, magnesia, and zinc oxide.

6. The thermally conductive film according to claim 2, wherein the thermally conductive filler of the component (C) is one or more selected from silver, aluminum, alumina, aluminum nitride, aluminum hydroxide, magnesia, and zinc oxide.

7. The thermally conductive film according to claim 3, wherein the thermally conductive filler of the component (C) is one or more selected from silver, aluminum, alumina, aluminum nitride, aluminum hydroxide, magnesia, and zinc oxide.

8. The thermally conductive film according to claim 4, wherein the thermally conductive filler of the component (C) is one or more selected from silver, aluminum, alumina, aluminum nitride, aluminum hydroxide, magnesia, and zinc oxide.

* * * * *